United States Patent [19]

Hanna

[11] 4,025,870

[45] May 24, 1977

[54] LOW DISTORTION AMPLIFIER HAVING HIGH SLEW RATE AND HIGH OUTPUT IMPEDANCE

[75] Inventor: John E. Hanna, Scottsdale, Ariz.

[73] Assignee: Motorola, Inc., Chicago, Ill.

[22] Filed: Nov. 17, 1975

[21] Appl. No.: 632,436

[52] U.S. Cl. .................................. 330/20; 330/22; 330/25; 330/28

[51] Int. Cl.² .......................................... H03F 1/34

[58] Field of Search .................. 330/20, 22, 25, 28, 330/30.5, 32, 38 M; 307/299.3; 179/15 BT

[56] References Cited

UNITED STATES PATENTS

| | | | |
|---|---|---|---|
| 3,460,048 | 8/1969 | Fichtner | 330/25 |
| 3,800,239 | 3/1974 | Callahan | 330/25 X |
| 3,914,704 | 10/1975 | Craft | 330/30 D X |

OTHER PUBLICATIONS

Ahmed, "Zero–Offset Potential Follower Circuits," RCA Technical Notes, Tn No. 938, Oct. 2, 1973.

Primary Examiner—James B. Mullins
Attorney, Agent, or Firm—Maurice J. Jones, Jr.

[57] ABSTRACT

The disclosed amplifier circuit includes a common base transistor, a turn-around device and a driver transistor, which is connected to a filter. An emitter follower stage is also connected to the filter. The turn-around device is connected between the common base and driver transistors. A diode connected transistor is utilized for compensating for the nonlinearity of the common base transistor. A first negative feedback path is provided between the driver and common base transistors to stabilize bias levels, increase amplifier output impedance and reduce distortion. A frequency compensation capacitor is connected to the driver transistor and a second negative feedback path is provided from the output of the emitter follower stage to the driver transistor. The second negative feedback path facilitates rapid discharge of the capacitor and driver transistor, a high slew rate and compensates for the nonlinearity of the emitter follower.

14 Claims, 3 Drawing Figures

LOW DISTORTION AMPLIFIER HAVING HIGH SLEW RATE AND HIGH OUTPUT IMPEDANCE

BACKGROUND OF THE INVENTION

Audio amplifiers for increasing the electrical power level of audio frequency input signals without distorting them are required in many applications. In particular, stereo decoder amplifiers are sometimes required in quality stereo equipment for amplifying the signal at the output terminal of the stereo decoder and applying it to a deemphasis filter network including a resistor and capacitor having values set by the industry. Such stereo decoder amplifiers are required to have a high output impedance so that they do not undesirably affect the filter characteristics. A buffer amplifier is usually connected to the output terminal of the deemphasis filter so that the load also does not affect the time constant of the filter. In solid state circuits, this buffer amplifier has usually been in the form of an emitter follower circuit which tends to undesirably distort the filtered output signal.

When the composite stereo signal is indicating a center location for the sound source, the left channel (L) and right channel (R) decoder output signals have approximately the same wave forms. Also, under these conditions the decoder output signals have abrupt transitions. Unless the decoder amplifier has high positive and negative slew rates, so that the output signal thereof is able to follow these input signals, the ouput signal of the amplifier will be of reduced amplitude and contain distortion. The reduction in amplitude is caused by the slow switching in the decoder amplifier which reduces the magnitude of the energy transferred. The distortion can be caused by asymmetric rise and fall times of the response characteristic of the decoder amplifier which produces undesirably different amounts of energy transfer to the load during the positive and negative excursions of the driving signal. For instance, if the amplifier responds more quickly to the positive transitions than to the negative transitions then the average of the energy transfer is greater for positive going signals than for negative going signals, which results in second harmonic distortion in the decoder amplifier output signal. Therefore, it is important for such amplifiers to have a high enough slew rate so that it can adequately respond to the abrupt transitions of the signal at the decoder output. Moreover, the decoder amplifier should have a linear transfer characteristic so that is does not create other distortion in the signal passing therethrough.

Monolithic stereo decoder integrated circuit amplifiers have sometimes included a single stage PNP "turn-around" transistor. Such circuits operate adequately if no gain is required of the amplifier. However, if even a gain of two is desired, the PNP device is required to conduct an undesirably large amount of current which causes its beta characteristics to become unpredictable and nonlinear, or to be undesirably large. Alternatively, if the quiescent current through such devices has a low magnitude, designing the circuit to provide any gain causes an undesirably large change in the base-to-emitter voltage due to large dynamic output signals which tend to cause a nonlinear relationship between the output current and the input voltage.

Consequently, other more complicated prior art stereo decoder amplifiers have been developed which utilize differential amplifiers having current sources and turn-around circuits. Such circuits are undesirable because of their complexity which results in increased chip cost as a consequence of the large amount of area required by the amplifier and because of their limited output swings due to required bias voltage drops across them. In particular, the current sources thereof require a plurality of devices which generally must be connected between the positive and negative power supply conductors. The complexity of the layout of these circuits reduces their attractiveness. Also, prior art stereo decoders include frequency compensating capacitors which sometimes tend to prevent them from rapidly turning off which tends to reduce the negative slew rate and distorts the stereo signals.

SUMMARY OF THE INVENTION

Accordingly, one object of the invention is to provide an improved amplifier circuit.

Another object of the invention is to provide an amplifier circuit having gain, high output impedance, and low distortion while permitting the output signal amplitude thereof to have a maximized swing.

A further object of the invention is to provide a stereo decoder amplifier configuration suitable for being manufactured in monolithic integrated circuit form and for interfacing between the output terminal of a stereo decoder and a deemphasis network.

A still further object of the invention is to provide an interface circuit between the output of a stereo decoder and a deemphasis filter which maintains its high levels of performance even though the quiescent levels at the decoder output vary.

An additional object of the invention is to provide a stereo decoder amplifier for interfacing between the output terminal of the stereo decoder and a deemphasis network which compensates for the nonlinearities of an emitter follower buffer amplifier stage connected to the deemphasis network.

A still additional object of the invention is to provide a stereo decoder amplifier having a high slew rate.

Briefly, an amplifier configuration in accordance with the invention includes an input electron control device, a current turn-around means and a driver electron control device. The input electron control device has a first electrode adapted to receive an input signal, a second electrode and a control electrode. The control terminal of the current turn-around means is connected to the second electrode of the input electron control device. The driver electron control device includes a control electrode coupled to receive the output signal from the current turn-around circuit, a first electrode connected to provide an output terminal for the amplifier and a second electrode connected to provide a first negative feedback signal to the control electrode of the input electron control device. The first negative feedback path stabilizes the magnitudes of quiescent currents in the amplifier, reduces distortion and increase amplifier output impedance. In addition, an emitter follower buffer stage and a frequency compensating capacitor can be connected to the driver electron control device. Moreover, a second negative feedback path can be connected between an output terminal of the emitter follower stage and the driver electron control device. The second negative feedback path enables rapid discharge of the capacitor, the driver electron control device and compensates for the nonlinearity of the emitter follower stage.

DETAILED DESCRIPTION OF THE PREFERRED EMBODIMENT

Figure 1:
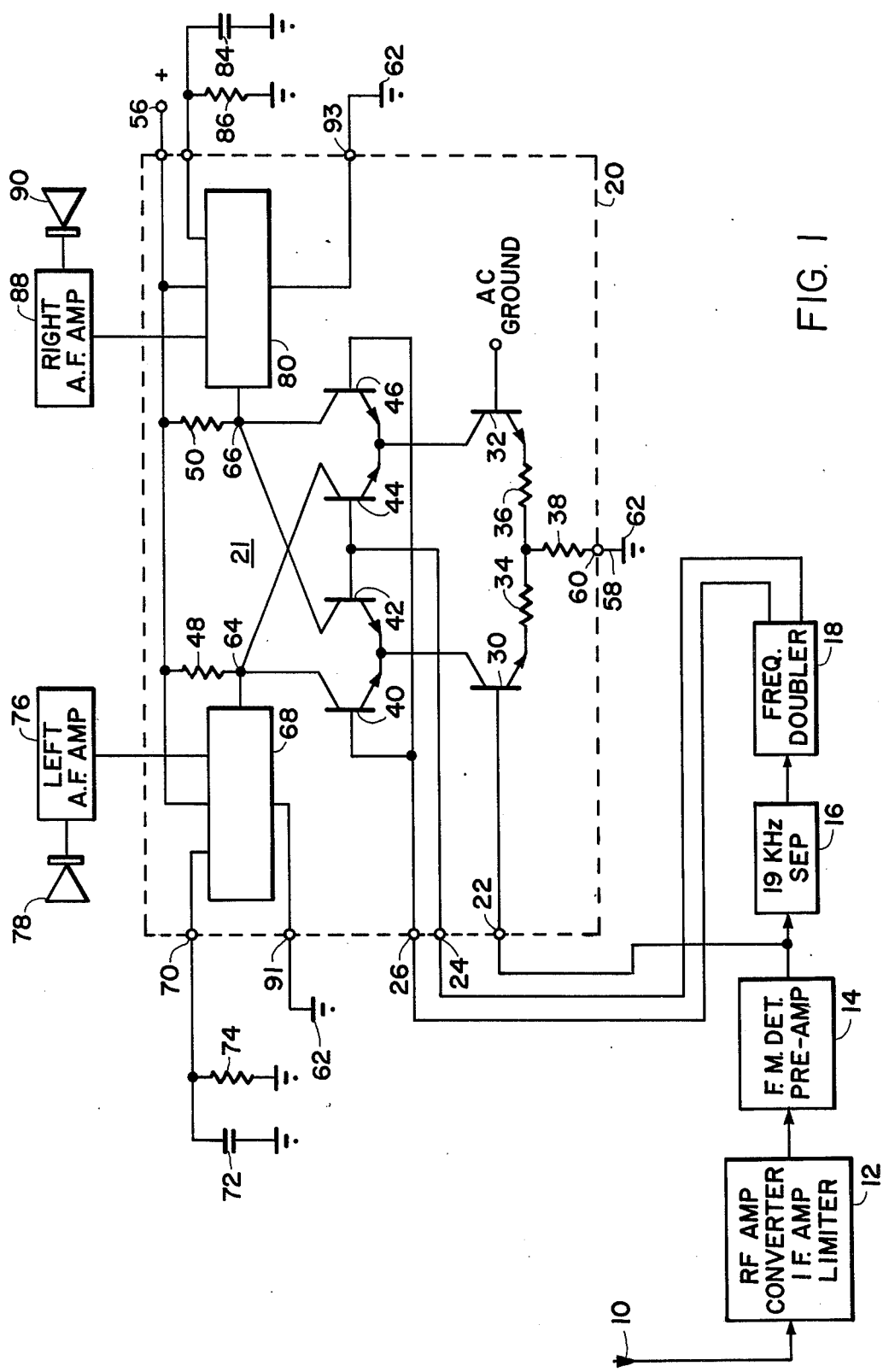
FIG. 1 is a block and schematic diagram of a F.M. stereo receiver which details a stereo decoder circuit.

Referring now to FIG. 1, there is shown a block and schematic diagram of a stereophonic multiplex receiver including an integrated circuit having a demodulator or decoder circuit, a stereo decoder amplifier and an emitter follower buffer amplifier. A frequency modulated (FM) carrier wave is received by antenna 10. The FM wave is frequency modulated by the sum of the left and right audio signals (L+R) and the difference of the left and right audio signals (L−R) which are amplitude modulated on a suppressed carrier wave, and a pilot signal having a frequency one-half that of the suppressed subcarrier frequency. The modulated FM carrier wave is applied to input circuit 12 which includes an RF amplifier, converter, IF amplifier and limiter which may be of known design. The output signal of circuit 12 is supplied to FM detector and preamplifier circuit 14 which demodulates the composite stereo signal.

The 19 KHz pilot signal component can be detected and separated by 19 KHz signals separating circuit 16 which generally includes a tank circuit. The 19 KHz pilot signal is then applied to frequency doubler 18 which reconstructs the suppressed 38 KHz subcarrier signal and applies it to output terminals thereof. The recovery of the subcarrier signal can also be performed by a phase-lock loop in a known manner.

Integrated circuit 20 includes input terminal 22 which is connected to detector 14 to receive the composite stereo signal and input terminals 24 and 26 which are connected to receive the 38 KHz subcarrier from frequency doubler 18. Decoder 21 has a configuration similar to that described in U.S. Pat. No. 3,617,641, entitled "Stereo Multiplex Democulator," of James. H. Fiet and Francis H. Hilbert and which is assigned to the same assignee as the subject application. The subject matter of the aforementioned patent is incorporated by reference herein.

Decoder 21 includes a first pair of transistors 30, 32 having emitter electrodes interconnected by a T-network including resistors 34, 36 and 38. The collectors of transistors 30 and 32 are respectively connected to transistors pairs 40, 42 and 44, 46. Amplifiers 68 and 80 respectively provide loads for transistors 40, 44 and 42, 46. Positive supply conductor 52 is connected through terminal 54 to positive power supply terminal 56 and negative supply conductor 58 is connected through terminal 60 to a ground point 62.

In operation, decoder 21 responds to the 38 KC gating signals at terminals 24 and 26 to alternately render transistors 40 and 42 conductive and nonconductive. At the same time, transistor 30 is operated Class A so that the amplified composite stereo signal present on the collector of transistor 30 is coupled directly through the fully turned on transistor 40 or 42 to corresponding left output terminal 64 or right output terminal 66. Transistors 44 and 46 operate to reduce channel cross talk between the left channel and right channel output signals in the manner explained in the aforementioned patent.

Integrated circuit 20 also includes stereo decoder and buffer amplifiers 68 and 80. The stereo decoder amplifier portion of amplifier 68 couples the left channel decoded signal to pinout terminal 70 which is connected to an external deemphasis circuit including capacitor 72 and resistor 74. The buffer amplifier portion of amplifier 68 couples the deemphasized signal to left channel audio frequency amplifier 76 which amplifies the deemphasized signal and applies it to loudspeaker 78. The stereo decoder amplifier portion of amplifier 80 is connected between right channel decoder output terminal 66 and pinout terminal 82. A right channel deemphasis network, including capacitor 84 and resistor 86, is connected to terminal 82. The buffer portion of amplifier 80 couples the deemphasized signal to pinout terminal 83 which is connected to the input terminal of right channel audio frequency amplifier 88. Loudspeaker 90 is connected to the output terminal of amplifier 88. Amplifiers 68 and 80 are also respectively connected through pinouts 91 and 93 to ground point 62 and to positive supply conductor 52.

Figure 2:
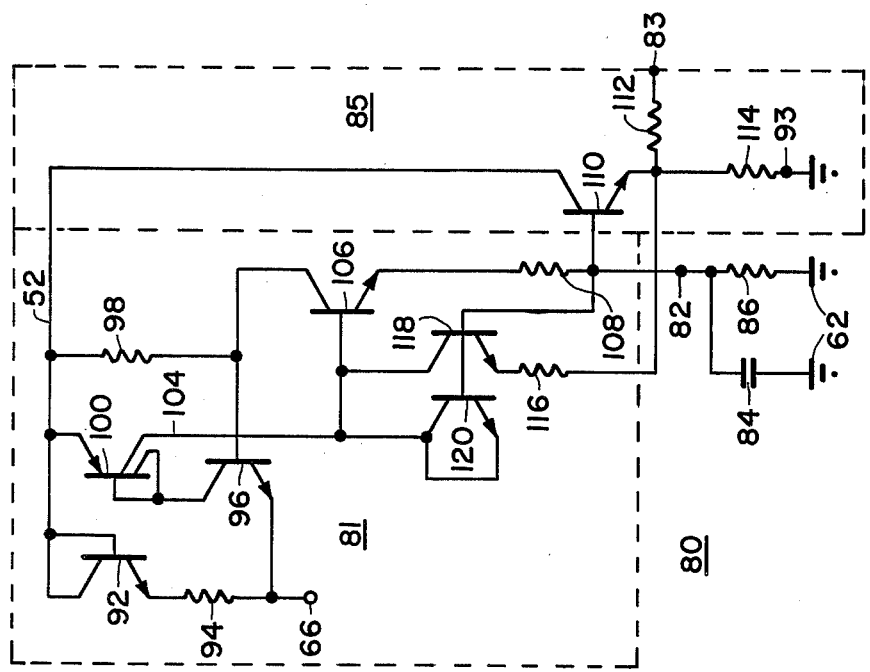
FIG. 2 is a schematic diagram of a stereo decoder amplifier, deemphasis network and emitter follower buffer amplifier which is suitable for use with the stereo decoder of FIG. 2.

FIG. 2 shows a schematic diagram of amplifier 80 which is represented in block form in FIG. 1 and which includes decoder amplifier stage 81 and emitter follower buffer amplifier stage 85. Since amplifier 68 can have the same configuration as amplifier 80 the following description is applicable to amplifier 68. The quiescent operation of decoder amplifier stage 81 will next be described. Decoder 21, which is direct-coupled to terminal 66, establishes a quiescent potential at terminal 66 which is lower in magnitude than the positive supply potential at conductor 52. Accordingly, quiescent current flows through the series path including diode connected NPN transistor 92 and resistor 94 which are connected between conductor 52 and terminal 66. An ordinary diode could be used in place of diode connected transistor 92. The quiescent voltage at terminal 66 also allows NPN common-base input transistor 96 to be conductive in response to base current conducted by resistor 98, which is connected between supply conductor 52 and the base electrode of transistor 96. Consequently, transistor 96 has a queiscent collector current equal to the sum of the base current and the collector current, for collector 102, of turn-around transistor 100. Collector 104 of transistor 100 provides a quiescent current which may be approximately equal to the collector current of transistor 96 except for the effects of the lower beta transistor 100. Current from collector 104 provides quiescent base current to NPN driver transistor 106. Resistor 98, which is connected between conductor 52 and the collector of transistor 106, provides quiescent collector current for driver transistor 106.

The emitter electrode of transistor 106 is connected through resistor 108 to pinout terminal 82. As previously described, deemphasis network 84 and 86 is connected between pinout terminal 82 and ground point 62.

The connection of the collector electrode of transistor 106 to the base electrode of transistor 96 closes a negative feedback loop which tends to stabilize the quiescent operating point of transistor 96 and increases the output impedance of amplifier portion 81. More particularly, if the quiescent voltage at the base of transistor 96 undesirably increases, the current in transistors 96, 100 and 106 tends to undesirably increase. Thus, transistor 106 becomes more conductive to lower the voltage at the base of transistor 96 by increasing the voltage drop across resistor 98, counteracting the initially assumed increase in voltage at this point. Consequently, transistors 96, 100 and 106 tend to be stabilized at their quiescent voltage and current levels. Alternatively, if the quiescent voltage level at the base of transistor 96 decreases, then transistors 96, 100 and 106 tend to be rendered less conductive. Consequently, the voltage at the collector of transistor 106 tends to increase to return the quiescent voltage and current levels to their desired magnitude. Thus, the negative feedback path tends to stabilize the quiescent voltages and currents of transistors 96, 100 and 106.

Emitter follower NPN output transistor 110 of buffer amplifier stage 85 includes a collector electrode connected to conductor 52, an emitter electrode connected through resistor 114 and terminal 93 to ground point 62 and a base electrode connected to terminal 82 and to one end of resistor 108. The resistance of resistor 114 is chosen to establish the quiescent voltage level of transistor 110. The emitter electrode of transistor 110 is also connected to output terminal 83 by resistor 112.

Resistor 116 and transistor 118 form another negative feedback path between the emitter of transistor 110 and the base of transistor 106. Resistor 116 is connected between the emitter electrode of transistor 110 and the emitter electrode of NPN transistor 118. Transistor 118 further includes a base electrode connected to the base electrode of transistor 110 and a collector electrode connected to the base electrode of transistor 106. Hence, the base-to-emitter voltage of transistor 110 is applied across the series circuit including the base-to-emitter junction of transistor 118 and resistor 116. Transistors 110 and 118 conduct different quiescent current densities because of their emitter structures and therefore have different base-to-emitter voltages. The difference in these voltages is applied across resistor 116 and defines the quiescent current of transistor 118. The collector current of transistor 118 is subtracted from the base drive to transistor 106.

Transistor 120 includes collector and emitter electrodes which are connected together and to the base electrode of transistor 106 and to the collector electrode 104 of transistor 100. The base electrode of transistor 120 is connected to the base electrode of transistor 118. Transistor 120 forms a capacitive device which provides a dominant pole for frequency stabilizing the feedback loop including transistors 96, 100 and 106. Since capacitor 120 has to only support a small breakdown voltage, it can be constructed in a minimal die surface area.

Figure 3:
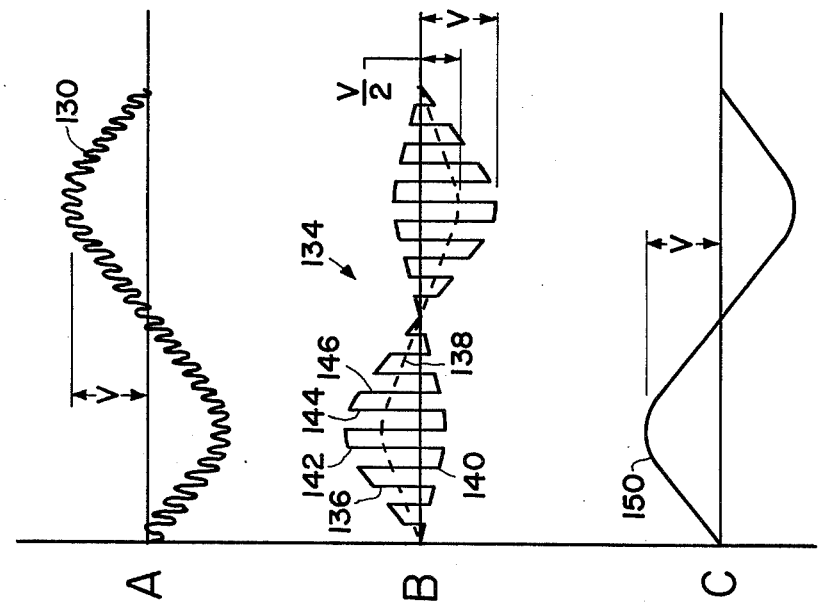

As previously explained, during dynamic operation a composite stereo input signal is applied to terminal 22 of decoder 20. A representation of one cycle of composite stereo signal for a center (L=R) location of the sound source is shown in FIG. 3A by waveform 130. The 38 KHz decoding signal applied to terminal 26 is a rectangular wave having symmetrical positive and negative portions. Decoder 21 provides a right switched output signal represented by waveform 134 of FIG. 3B at terminal 66. Waveform 136 represents the 38 KHz switching signal and waveform 138 represents the average value of waveform 134 which corresponds to the desired right channel signal.

Amplifiers 68 and 80 must amplify the switched output currents of waveform 134 which include abrupt transitions from one level to another. If amplifier 80 is unable to switch at transition points 140 and 142 for instance, the magnitude of the resulting output signal will be undesirably reduced. Moreover, amplifiers 68 and 80 must have rise times or poistive slew rates capable of following a positive transition such as portion 144 and fall times or negative slew rates capable of following a negative transition such as portion 146. If the rise and fall times of the amplifier output signal are asymetric, then the resulting decoder amplifier output signal will have a peak of one relative polarity having an amplitude greater than the amplitude of the other peak in response to a symmetrical input signal, thus resulting in second harmonic distortion of the decoder amplifier output signal.

The dynamic voltage at input terminal 66 appears at the collector of driver transistor 106 except for the change in voltage drop of the base-to-emitter junction of common base amplifier transistor 96. Diode connected turn-around transistor 100 can be arranged to amplify the common base amplifier dynamic collector current of transistor 96 so that a current of increased magnitude drives transistors 106 and 120. Dual collector transistor 100 can be replaced by a single collector transistor and diode. Thus, when the dynamic input current is increasing a large current can be conducted by transistors 96 and 100 for charging capacitor 120 and for driving transistor 106. Consequently, amplifier 80 is capable of following positive transitions such as 142 having steep slopes and therefore has a high positive slew rate. Furthermore, the series circuit including the collector-to-emitter path of transistor 118 and resistor 116 operates to pull base current out of transistors 106 and 120 to enable them to follow falling portion 144 of waveform 138, for instance. Thus amplifier 81 has a high negative slew rate.

The high slew rate of decoder amplifier stage 81 tends to enable an undistorted output signal of high level to be applied to the deemphasis network connected to terminal 82.

The configuration of amplifier 81 also tends to reduce distortion of the signal passed therethrough otherwise caused by semiconductor junctions. More specifically, it is well known that base-to-emitter characteristic of bipolar transistors such as transistors 96 and 110 tend to be nonlinear and distort signals passed through them. Diode connected transistor 92 tends to predistort the drive signals applied to transistor 96 thereby compensating for the nonlinearity of the base-emitter junction of transistor 96. Changes in the base-emitter voltage of transistor 110 are sensed by transistor 118 and resistor 116, which feedback a current to the base of transistor 106 to compensate for the change in transistor 110. Consequently, the output signals of transistors 96 and 110 tend to be more linear than they would be if diode 92 and transistor 118 were not included in the circuit. Also, the negative feedback loop from the collector of transistor 106 to the base of transistor 96 further tends to reduce distortion. Since diode connected transistor 92 is an emitter follower, it can be placed in a resistor island and therefore does not require separate isolation, thereby saving space.

Decoder amplifier stage 81 also enables the output voltage swing at terminals 82 and 83 to have maximized magnitudes. The circuit can be designed so that transistors 100 and 106 go into saturation simultaneously near the peak of the positive output voltage 134 of FIG. 3B provided by decoder 21. Consequently, the peak amplitude of the output voltage at terminal 82 is limited only by the voltages drop across resistors 98 and 108 and saturated transistor 106. Since resistor 108 can have a resistance 300 ohms or less, the resistance of resistor 98, which can have a resistance of 440 ohms, tends to be the limiting parameter on the maximum output voltage amplitude. Since resistor 86 has a resistance of 3.9K ohms, nearly the entire supply potential on conductor 52 can be available at terminal 82 at the positive peak of the output signal. Resistors 94 and 116 can have resistances of 850 ohms and 5 kilohms respectively.

Stereo decoder amplifier 81 provides a high output impedance at terminal 82 because of the negative feedback between transistor 106 and transistor 96. This high impedance enables amplifier 81 to appear as a current source which does not undesirably change the time-constant of deemphasis filter 84, 86. Emitter follower stage 85 isolates the deemphasis filter from the load of amplifier 80 which is connected to terminal 83.

Therefore, amplifier 80 of one embodiment of the invention has been described. Transistors 96, 100 and 106 of stereo decoder amplifier portion 81 amplify the dynamic input signal applied at terminal 66. One negative feedback path between the collector of transistor 106 and the base of common base input transistor 96 enables stereo decoder amplifier portion 81 to have low distortion, a high output impedance, and tends to stabilize the magnitudes of the bias levels throughout amplifier portions 81 and 85. Another negative feedback path is provided through transistor 118 and resistor 116 which further decreases distortion by compensating for the nonlinearity of the base-to-emitter junction of transistor 110 and increases the negative slew rate by providing for discharge of capacitive device 120. By designing stereo decoder amplifier portion 81 so that transistors 100 and 106 go into saturation at the peak of the input signal, the output signal amplitude is maximized. Amplifier 80 is suitable for being manufactured in monolithic integrated circuit form and for interfacing between output terminal 66 of stereo decoder 21 and the deemphasis network including capacitor 84 and resistor 86. The high slew rate of amplifier 80 enables it to respond to a stereo channel signal indicating a center position of the sound source such as shown in FIG. 3B by waveform 134 to provide an amplified, substantially distortion free signal as indicated in FIG. 3C by waveform 150 which is suitable for driving an audio frequency amplifier such as amplifier 88 of FIG. 1. The utilization of diode 92 and the low voltage requirement of capacitive device 120 enables stereo decoder amplifier portion 81 to be built in a minimum of space if provided in monolithic integrated circuit form.

I claim:
1. An amplifier circuit including in combination:
   first electron control means for amplifying an input signal, said first electron control means including common base connected transistor means having an emitter electrode to which the input signal is directly applied, a collector electrode at which an output signal is created and a base electrode;
   current turn-around means having an input terminal adapted to receive the signal from the first electron control means and an output terminal; and
   second electron means having a control electrode coupled to receive an output signal from said turn around means, a first electrode coupled to an output terminal for the amplifier circuit and a second electrode connected to provide negative feedback to said base electrode of said common base connected transistor means for stabilizing the magnitudes of the quiescent signals in the amplifier.

2. The amplifier circuit of claim 1 wherein:
   said amplifier circuit further includes diode means coupled to said emitter electrode of said common base connected transistor means for reducing the distortion of the dynamic signal caused by the emitter-to-base junction of said common base connected transistor means.

3. The amplifier circuit of claim 1 wherein said current turn-around means includes:
   PNP transistor means having emitter, base and first and second collector electrodes;
   first means connecting said first collector electrode and said base electrode of said PNP transistor means to said collector electrode of said common base connected transistor means; and
   second means connecting said second collector electrode to said control electrode of said second electron control means.

4. The amplifier circuit of claim 1 further wherein said second electron control means includes an NPN transistor having emitter, base and collector electrodes respectively corresponding to said first, control and second electrodes thereof.

5. The amplifier circuit of claim 1 further including:
   capacitive means connected to said control electrode of said second electron control means for providing frequency stabilization;
   further transistor means for increasing the negative slew rate of the amplifier circuit, said further transistor means having a collector electrode connected to said control electrode of said second electron control means, a base electrode coupled to said first electrode of said second electron control means, and an emitter electrode; and
   a bias circuit including resistive means and semiconductor junction means connected between said emitter electrode and said base electrode of said further transistor means.

6. The amplifier circuit of claim 5 wherein said junction means includes the base-to-emitter junction of an emitter follower transistor coupled to said first electrode of said second electron control means, said base-to-emitter voltage of said further transistor means tending to reduce the distortion effects otherwise caused by the base-to-emitter junction of said emitter follower transistor.

7. An amplifier circuit provided in monolithic integrated circuit form including in combination:
   signal supply means adapted to provide an input signal for the amplifier circuit at an output terminal thereof;
   an input transistor of one conductivity type having an emitter electrode connected to said output terminal of said signal supply means to receive said input signal, a base electrode and a collector electrode;
   a current turn-around circuit including a multi collector transistor of a another conductivity type having base and first collector electrodes coupled to said collector electrode of said input transistor, an emitter electrode and a second collector electrode;

a driver transistor of said one conductivity type having a base electrode connected to said second collector electrode of said transistor of said current turn-around circuit, an emitter electrode, and a collector electrode;

first circuit means providing a negative feedback path from said collector electrode of said driver transistor to said base electrode of said input transistor so that said input transistor said current turn-around circuit and said driver transistor have controlled quiescent operating points; and second circuit means connecting said emitter electrode of said driver transistor to an output terminal.

8. The amplifier circuit of claim 7 further including: diode means and resistive means connected in series to provide a series circuit for compensating for the nonlinearity of the base-to-emitter junction of said input transistor, said series circuit being connected to said emitter electrode of said input transistor.

9. The amplifier circuit of claim 7 further including: semiconductor capacitor means coupled to said base electrode of said driver transistor means and to said second circuit means.

10. The amplifier circuit of claim 7 wherein said signal supply means includes a stereo decoder circuit which is coupled to said emitter electrode of said input transistor means.

11. The amplifier circuit of claim 7 wherein said second circuit means includes resistive means.

12. The amplifier circuit of claim 7 further including: an emitter follower amplifier stage having an emitter follower transistor of said one conductivity type with a base electrode to said second circuit means, a collector electrode and an emitter electrode; and a further transistor of said one conductivity type for compensating for the nonlinearity of said emitter follower transistor, said further transistor having a collector electrode connected to said base electrode of said driver transistor, a base electrode connected to said base electrode of said emitter follower transistor, and an emitter electrode coupled to said emitter electrode of said emitter follower transistor, said further transistor means compensating for the nonlinearity of the base-to-emitter junction of said emitter follower transistor.

13. The amplifier circuit of claim 12 further including means for coupling a deemphasis filter to said base electrode of said emitter follower transistor and to said second circuit means.

14. An amplifier circuit including in combination:
first electron control means for amplifying an input signal and having a first electrode to which the input signal is applied, a second electrode at which an output signal is created and a control electrode;

turn around means having an input terminal adapted to receive the signal from the first electron control means and an output terminal;

second electron control means having a control electrode coupled to receive an output signal from said turn around means, a first electrode connected to provide an output terminal for the amplifier circuit and a second electrode connected to provide negative feedback to said control electrode of said first electron control means for stablizing the magnitudes of the quiescent signals in the amplifier;

capacitive means coupled to said control electrode of said second electron control means for providing frequency stabilization;

further transistor means for increasing the negative slew rate of the amplifier circuit, said further transistor means having a collector electrode coupled to said control electrode of said second electron control means, a base electrode coupled to said first electrode of said second electron control means, and an emitter electrode; and a bias circuit including resistive means and semiconductor junction means connected between said emitter electrode and said base electrode of said further transistor means.

* * * * *